(12) United States Patent
Kuon et al.

(10) Patent No.: US 10,910,592 B2
(45) Date of Patent: Feb. 2, 2021

(54) FLEXIBLE ELECTROLUMINESCENT DISPLAY DEVICE

(71) Applicant: LG DISPLAY CO., LTD., Seoul (KR)

(72) Inventors: IkHyun Kuon, Chilgok-gun (KR); JeongKweon Park, Paju-si (KR); MoonGoo Kim, Paju-si (KR); Chan Park, Gumi-si (KR); SangGul Lee, Seoul (KR); YongSoo Kim, Chilgok-gun (KR); SangEun Han, Jeonju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 109 days.

(21) Appl. No.: 16/049,300

(22) Filed: Jul. 30, 2018

(65) Prior Publication Data

US 2019/0198801 A1 Jun. 27, 2019

(30) Foreign Application Priority Data

Dec. 22, 2017 (KR) .................. 10-2017-0178765
Feb. 5, 2018 (KR) .................. 10-2018-0014041

(51) Int. Cl.
*G06F 3/041* (2006.01)
*H01L 27/32* (2006.01)
(Continued)

(52) U.S. Cl.
CPC ........ *H01L 51/5246* (2013.01); *G06F 3/0412* (2013.01); *G06F 3/04164* (2019.05); *H01L 27/323* (2013.01); *H01L 27/3262* (2013.01); *H01L 27/3276* (2013.01); *H01L 51/0097* (2013.01); *H01L 51/5253* (2013.01); *H01L 51/5281* (2013.01); *G06F 3/044* (2013.01);
(Continued)

(58) Field of Classification Search
None
See application file for complete search history.

(56) References Cited

U.S. PATENT DOCUMENTS

2016/0113106 A1* 4/2016 Kim .................. H05K 1/028
361/749
2017/0047547 A1* 2/2017 Son .................. H01L 25/167
(Continued)

FOREIGN PATENT DOCUMENTS

JP        2011-7830 A        1/2011
KR   10-2015-0112715 A     10/2015
(Continued)

*Primary Examiner* — Kent W Chang
*Assistant Examiner* — Benjamin Morales
(74) *Attorney, Agent, or Firm* — Birch, Stewart, Kolasch & Birch, LLP

(57) ABSTRACT

A flexible electroluminescent display device can include a flexible substrate including an active area and a bending area extending from one side of the active area to be bent; a thin film transistor and a light emitting diode on the active area; a touch screen panel on the active area; a touch circuit board connected to the touch screen panel and bent at an outer periphery of the bending area of the flexible substrate; a polarizer disposed on the touch screen panel and covering a portion of the touch circuit board; and a step compensating layer disposed between the touch screen panel and the polarizer, the step compensating layer compensates a step between the touch screen panel and the touch circuit board.

20 Claims, 9 Drawing Sheets

(51) Int. Cl.
*H01L 51/00* (2006.01)
*H01L 51/52* (2006.01)
*G06F 3/044* (2006.01)

(52) U.S. Cl.
CPC .. *G06F 3/0446* (2019.05); *G06F 2203/04102* (2013.01); *H01L 27/3248* (2013.01); *H01L 2251/5338* (2013.01)

(56) References Cited

U.S. PATENT DOCUMENTS

| | | | |
|---|---|---|---|
| 2017/0090661 A1* | 3/2017 | Kim | G06F 3/0412 |
| 2017/0153734 A1* | 6/2017 | Kim | G06F 3/0412 |
| 2017/0277313 A1* | 9/2017 | Lee | G06F 3/0412 |
| 2018/0081399 A1* | 3/2018 | Kwon | H01L 51/0097 |
| 2018/0197933 A1* | 7/2018 | Son | H01L 51/5253 |

FOREIGN PATENT DOCUMENTS

| | | |
|---|---|---|
| KR | 10-2017-0095280 A | 8/2017 |
| KR | 10-2017-0125639 A | 11/2017 |

* cited by examiner

FLEXIBLE ELECTROLUMINESCENT DISPLAY DEVICE

CROSS-REFERENCE TO RELATED APPLICATIONS

This application claims the priority of Korean Patent Application No. 10-2017-0178765 filed in the Republic of Korea on Dec. 22, 2017, and Korean Patent Application No. 10-2018-0014041 filed in the Republic of Korea on Feb. 5, 2018. The entirety of all of these applications are incorporated herein by reference.

BACKGROUND

Field

The present disclosure relates to a flexible electroluminescent display device, and more particularly, to a flexible electroluminescent display device which can minimize a bezel area of the flexible electroluminescent display device.

Description of the Related Art

Entering a full-scale information era, display devices which visually expresses electrical information signals have been rapidly developed and studies continue to improve the performance of various display devices, such as thin-thickness, light weight, and low power consumption.

A representative display device may include a liquid crystal display device (LCD), a field emission display device (FED), an electro-wetting display device (EWD), and an organic light emitting display device (OLED).

The electroluminescent display device including an organic light emitting display device is a self-emitting display device, in which a separate light source is not necessary, which is different from the liquid crystal display device. Therefore, the electroluminescent display may be manufactured to be thin and light. Further, since the field emission display device is advantageous, not only in terms of power consumption but also in color implementation, response speed, viewing angle, and contrast ratio (CR), and due to the lower voltage driving, it is expected to be utilized in various fields.

In the electroluminescent display device, an emissive layer EML using an organic material is disposed between two electrodes formed of an anode and a cathode. When holes in the anode are injected to the emissive layer and electrons in the cathode are injected to the emissive layer, the injected holes and electrons are recombined and form excitons in the emissive layer to emit light.

The emissive layer includes a host material and a dopant material, in which interactions between two materials occur. The host serves to generate excitons from the electrons and holes and transmit energy to the dopant. The dopant is a dye organic material and a small amount of dopant is added to receive energy from the host and convert the energy into light.

The electroluminescent display device including an emissive layer formed of an organic material is encapsulated with glass, metal, or a film to suppress moisture or oxygen from entering into the electroluminescent display device from the outside. Therefore, oxidation of the emissive layer and the electrode is suppressed and the emissive layer and the electrode are protected from mechanical or physical impact applied from the outside.

SUMMARY

As the display device has become small, an effort to reduce a bezel area, which is an outer peripheral portion of an active area A/A, continues to increase an effective display screen size in the same area of the display device.

Normally, in the bezel area, which corresponds to a non-active area N/A, wiring lines and driving circuits for driving a screen are disposed, and there is a limitation in reducing the bezel area.

With respect to a flexible electroluminescent display device which applies a flexible substrate formed of a flexible material such as plastic, which has been developed in recent years to maintain a display performance even though it is bent, a technique which minimizes a bezel area by bending a non-active area of the flexible substrate has been developed and applied in order to minimize the bezel area while maintaining an area for the wiring lines and the driving circuits.

The flexible electroluminescent display device, which uses a flexible substrate, such as plastic, needs to ensure flexibility of a substrate, various insulating layers disposed on the substrate, and a wiring line formed of a metal material and suppress a failure such as a crack which may be caused by the bending.

Further, instead of an input unit, such as a mouse or a keyboard, which has been applied as an input unit of a display device in the related art, a display device with a touch screen panel that may directly input information on a screen of a display device using a finger or a pen by the user is utilized in various fields.

A touch screen panel disposed above the display device converts a contact position, which is in direct contact with a hand of the user of an object, into an electrical signal and receives instructions selected from the contact position as an input signal and displays the instructions on the screen through the display device.

Further, in a touch circuit board disposed in the bezel area, which is a non-active area of the display device, a wiring line and a touch circuit connected to the touch screen panel are disposed to drive the touch screen panel and an area for the wiring lines, and the touch circuit needs to be secured, which becomes an obstacle to minimizing the bezel area of the display device.

Therefore, inventors of the present disclosure invented an electroluminescent display device having a novel structure which can minimize an area of a touch circuit board of a touch screen panel disposed in a bezel area in the electroluminescent display device.

Further, the inventors recognized that as the resolution of the electroluminescent display device is increased, a space for disposing the wiring lines is insufficient and invented an electroluminescent display device having a novel structure which can more freely dispose the wiring lines in a limited space.

Objects of the present disclosure are not limited to the above-mentioned objects, and other objects, which are not mentioned above, can be clearly understood by those skilled in the art from the following descriptions.

According to an aspect of the present disclosure, a flexible electroluminescent display device includes: a flexible substrate including an active area and a bending area extending from one side of the active area to be bent; a thin film transistor and a light emitting diode on the active area; a touch screen panel on the active area; a touch circuit board which is connected to the touch screen panel and is bent at an outer periphery of the bending area; a polarizer which is disposed on the touch screen panel and covers a part of the touch circuit board; and a step compensating layer which is disposed on the touch screen panel and compensates a step between the touch screen panel and the touch circuit board.

According to another aspect of the present disclosure, a flexible electroluminescent display device includes: a flexible substrate which includes an active area and a non-active area which encloses an outer periphery of the active area and includes a bending area; a thin film transistor and a light emitting diode on the active area; a touch screen panel on the active area; a touch circuit board which is connected to the touch screen panel and is bent at an outer periphery of the bending area; a polarizer which is disposed on the touch screen panel and covers a part of the touch circuit board; and a step compensating layer which compensates a step between the touch screen panel and an end of the touch circuit board and is disposed on the touch screen panel.

Other detailed matters of the embodiments are included in the detailed description and the drawings.

An electroluminescent display device according to an example embodiment of the present disclosure can minimize the bezel area by minimizing an area occupied by a touch circuit board that is connected to a touch screen panel disposed above the flexible substrate.

An electroluminescent display device according to an example embodiment of the present disclosure can freely dispose the wiring lines used for the flexible electroluminescent display device within a limited space.

The effects according to the present disclosure are not limited to the contents exemplified above, and additional effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
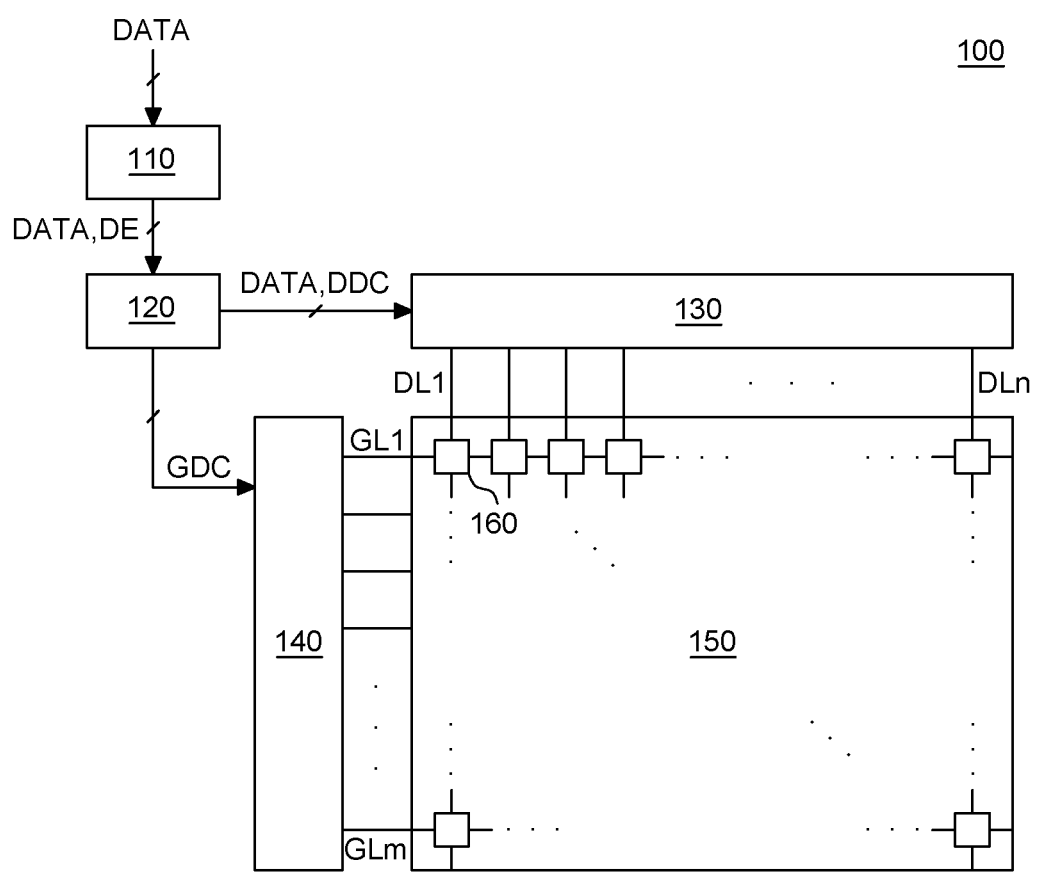
FIG. 1 is a block diagram of an electroluminescent display device according to an embodiment of the present disclosure.

Advantages and characteristics of the present disclosure and a method of achieving the advantages and characteristics will be clear by referring to example embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawings are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a flexible electroluminescent display device according to embodiments of the present disclosure will be described in detail with reference to accompanying drawings.

FIG. 1 is a block diagram of an electroluminescent display device according to an embodiment of the present disclosure.

Referring to FIG. 1, an electroluminescent display device 100 according to an exemplary embodiment of the present disclosure includes an image processing unit 110, a timing controller 120, a data driver 130, a gate driver 140, and a display panel 150.

The image processing unit 110 outputs a data enable signal DE together with a data signal DATA supplied from the outside. The image processing unit 110 may output one or more of a vertical synchronization signal, a horizontal synchronization signal, and a clock signal in addition to the data enable signal DE.

The timing controller 120 is supplied with the data signal DATA together with the data enable signal DE or a driving signal including the vertical synchronization signal, the horizontal synchronization signal, and the clock signal. The timing controller 120 outputs a gate timing control signal GDC for controlling an operation timing of the gate driver 140 and a data timing control signal DDC for controlling an operation timing of the data driver 130 based on the driving signal.

The data driver 130 samples and latches the data signal DATA supplied from the timing controller 120 in response to the data timing control signal DDC supplied from the timing controller 120 to convert the data signal into a gamma reference voltage and output the converted gamma reference voltage. The data driver 130 outputs the data signal DATA through data lines DL1 to DLn.

The gate driver 140 outputs the gate signal while shifting a level of the gate voltage in response to the gate timing control signal GDC supplied from the timing controller 120. The gate driver 140 outputs the gate signal through the gate lines GL1 to GLm.

The display panel 150 displays an image while the pixel 160 emits light in response to the data signal DATA and the gate signal supplied from the data driver 130 and the gate driver 140. A detailed structure of the pixel 160 will be described with reference to FIGS. 2 and 3.

Figure 2:
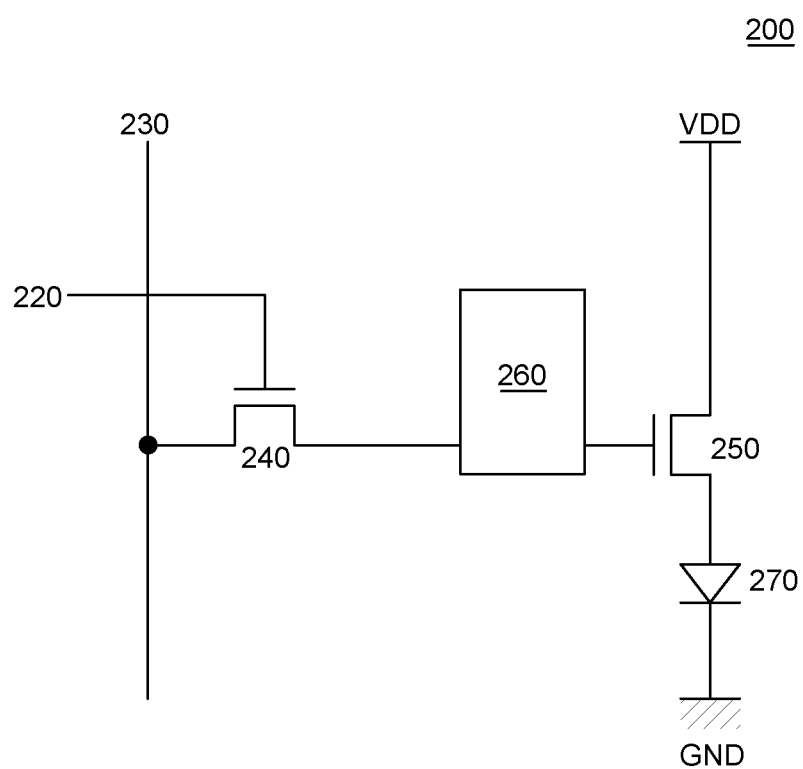
FIG. 2 is a circuit diagram of a pixel included in an electroluminescent display device according to an embodiment of the present disclosure.

FIG. 2 is a circuit diagram of a pixel included in an electroluminescent display device according to an embodiment of the present disclosure.

Referring to FIG. 2, the pixel of the electroluminescent display device 200 according to an embodiment of the present disclosure includes a switching transistor 240, a driving transistor 250, a compensating circuit 260, and a light emitting diode 270.

The light emitting diode 270 may operate to emit light in accordance with a driving current formed by the driving transistor 250.

The switching transistor 240 may perform a switching operation such that a data signal supplied through the data line 230 is stored in the capacitor as a data voltage in response to a gate signal supplied through the gate line 220.

The driving transistor 250 operates such that a predetermined driving current flows between a high potential power line VDD and a low potential power line GND in response to the data voltage stored in the capacitor.

The compensating circuit 260 is a circuit for compensating a threshold voltage of the driving transistor 250 and includes one or more thin film transistors and capacitors. A configuration of the compensating circuit may vary depending on a compensating method.

The pixel of the electroluminescent display device 200 is configured by a 2T (transistor) 1C (capacitor) structure including a switching transistor 240, a driving transistor 250, a capacitor, and a light emitting diode 270. When the compensating circuit 260 is added, the pixel of the electroluminescent display device 200 may be formed in various forms such as 3T1C, 4T2C, 5T2C, 6T1C, 6T2C, 7T1C, and 7T2C.

Figure 3A:
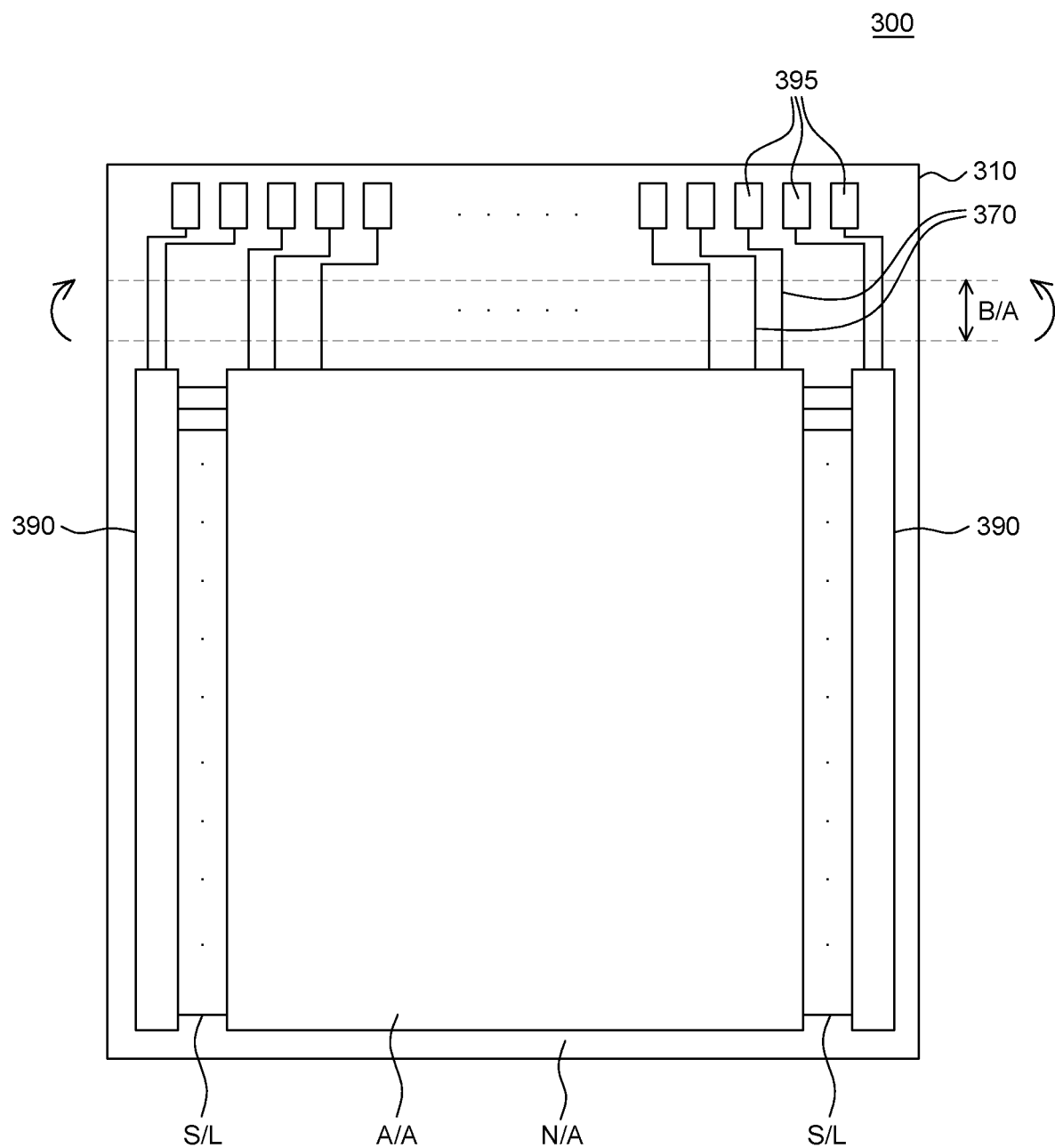
FIGS. 3A and 3B are plan views of a flexible substrate and a touch screen panel of an electroluminescent display device according to an embodiment of the present disclosure.
Figure 3B:
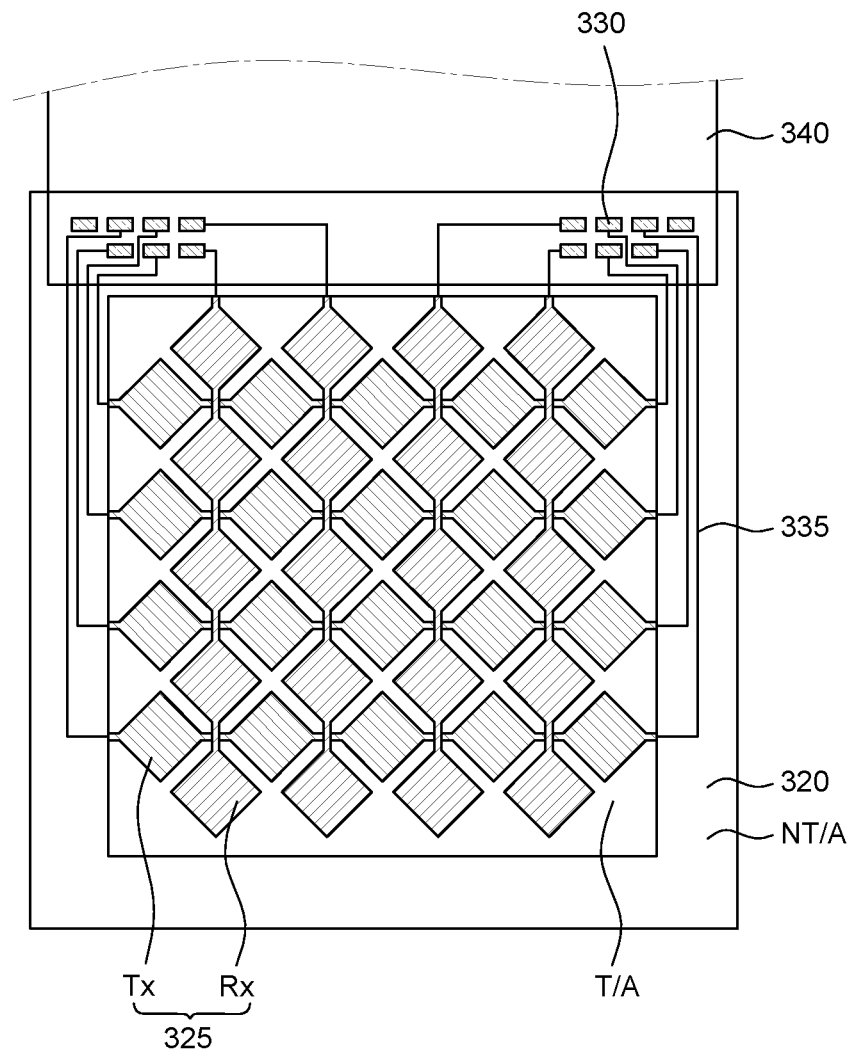

FIGS. 3A and 3B are plan views of a flexible substrate and a touch screen panel of an electroluminescent display device according to an embodiment of the present disclosure.

FIG. 3A illustrates a state when a flexible substrate 310 of a flexible electroluminescent display device 300 is not bent, and FIG. 3B illustrates a touch screen panel 320 disposed on a flexible substrate 310.

Referring to FIG. 3A, a flexible electroluminescent display device 300 according to an embodiment of the present disclosure can include an active area A/A in which a pixel that emits light through a thin film transistor and a light emitting diode is disposed on the flexible substrate 310, and a non-active area N/A enclosing an outer periphery of an edge of the active area A/A.

In the non-active area N/A of the flexible substrate 310, a circuit such as a gate driver 390 for driving the flexible electroluminescent display device 300 and various signal lines such as a scan line S/L can be disposed. A circuit for driving the flexible electroluminescent display device 300 can be disposed on the substrate 310 by a gate in panel (GIP) manner or connected to the flexible substrate 310 by a tape carrier package (TCP) or a chip on film (COF) manner.

A pad 395 is disposed at one side of the substrate 310 of the non-active area N/A. The pad 395 is a metal pattern to which an external module is bonded.

A part of the non-active area N/A of the flexible substrate 310 is bent in a bending direction represented by an arrow, in order to form a bending area B/A. Since the non-active area N/A of the flexible substrate 310 is an area where a wiring line and a driving circuit for driving a screen are disposed and images are not displayed, the non-active area N/A does not need to be visible from an upper surface of the flexible substrate 310. Therefore, a partial area of the non-active area N/A of the flexible substrate 310 is bent to minimize the bezel area while securing an area for the wiring lines and the driving circuit.

Various wiring lines are formed on the flexible substrate 310. The wiring lines can be formed in the active area A/A of the substrate 310. Alternately, the circuit line 370 formed in the non-active area N/A connects the driving circuit, the gate driver or the data driver to transmit a signal.

The circuit line 370 is formed of a conductive material and can be formed of a conductive material having excellent ductility to reduce cracks generated at the time of bending the substrate 310. For example, the circuit line 370 can be formed of a conductive material having excellent ductility, such as gold (Au), silver (Ag), and aluminum (Al) and formed of one of various conductive materials used in the active area A/A. The circuit line 370 may also be configured by molybdenum (Mo), chrome (Cr), titanium (Ti), nickel (Ni), neodymium (Nd), copper (Cu), and an alloy of silver (Ag) and magnesium (Mg). Further, the circuit line 370 can be configured by a multi-layered structure including various conductive materials and for example, configured by a triple-layered structure of titanium (Ti)/aluminum (Al)/titanium (Ti), but is not limited thereto.

When the circuit line 370 formed in the bending area B/A is bent, a tensile force is applied thereto. For example, the largest tensile force is applied to the circuit line 370 extending along the same direction as the bending direction (represented by an arrow) on the flexible substrate 310 so that a crack may be generated. When the crack is severe, the line may be broken. Therefore, the circuit line 370 is not formed to extend in the bending direction, but at least a part of the circuit line 370 disposed to include the bending area B/A is formed to extend in a diagonal direction which is different from the bending direction so that the tensile force is minimized, in order to minimize the generation of cracks.

The circuit line 370 disposed to include the bending area B/A can be formed in various shapes, for example, a trapezoidal wave shape, a triangular wave shape, a sawtooth wave shape, a sinusoidal wave shape, an omega (Ω) shape, and a rhombus shape.

Referring to FIG. 3B, the touch screen panel 320 is disposed on the flexible substrate 310 illustrated in FIG. 3A.

The touch screen panel 320 includes a touch area T/A correspondingly disposed on the active area A/A of the flexible substrate 310 and a non-touch area NT/A correspondingly disposed on the non-active area N/A enclosing an outer periphery of an edge of the active area A/A.

The touch electrode 325 is disposed in the touch area T/A of the touch screen panel 320. The touch electrode 325 can be configured such that a plurality of touch driving electrodes Tx and a plurality of touch sensing electrodes Rx intersect each other.

A mutual-capacitance type can be applied to the touch screen panel 320 to be configured by the touch electrode 325 which is configured such that the plurality of touch driving electrodes Tx and the plurality of touch sensing electrodes Rx intersect each other, but is not limited thereto and a self-capacitance type can also be applied. In the self-capacitance type, only a plurality of touch sensing electrodes Rx is disposed. Further, the touch screen panel 320 can be implemented by various manners, such as a resistive type or an electromagnetic type.

The touch pad 330 is disposed in the non-touch area NT/A of the touch screen panel 320 and disposed on the non-active area N/A on the flexible substrate 310.

The touch connecting line 335 serves to electrically connect the touch electrode 325 and the touch pad 330, and is disposed on the non-touch area NT/A of the touch screen panel 320.

A touch circuit board 340, which is connected to the touch pad 330 and is configured by an insulating film, is disposed at an end of the touch screen panel 320.

On the touch circuit board 340, various wiring lines for transmitting signals to the touch electrode 325 disposed in the touch area T/A and a touch sensing circuit for sensing a touch input are provided. The touch circuit board can be configured by a flexible printed circuit board (FPCB).

The touch circuit board 340 can be disposed to be bent while enclosing an outer periphery of the bending area B/A of the flexible substrate 310 illustrated in FIG. 3A, and a detailed structure of the bending area B/A will be described with reference to FIG. 5.

Figure 4A:
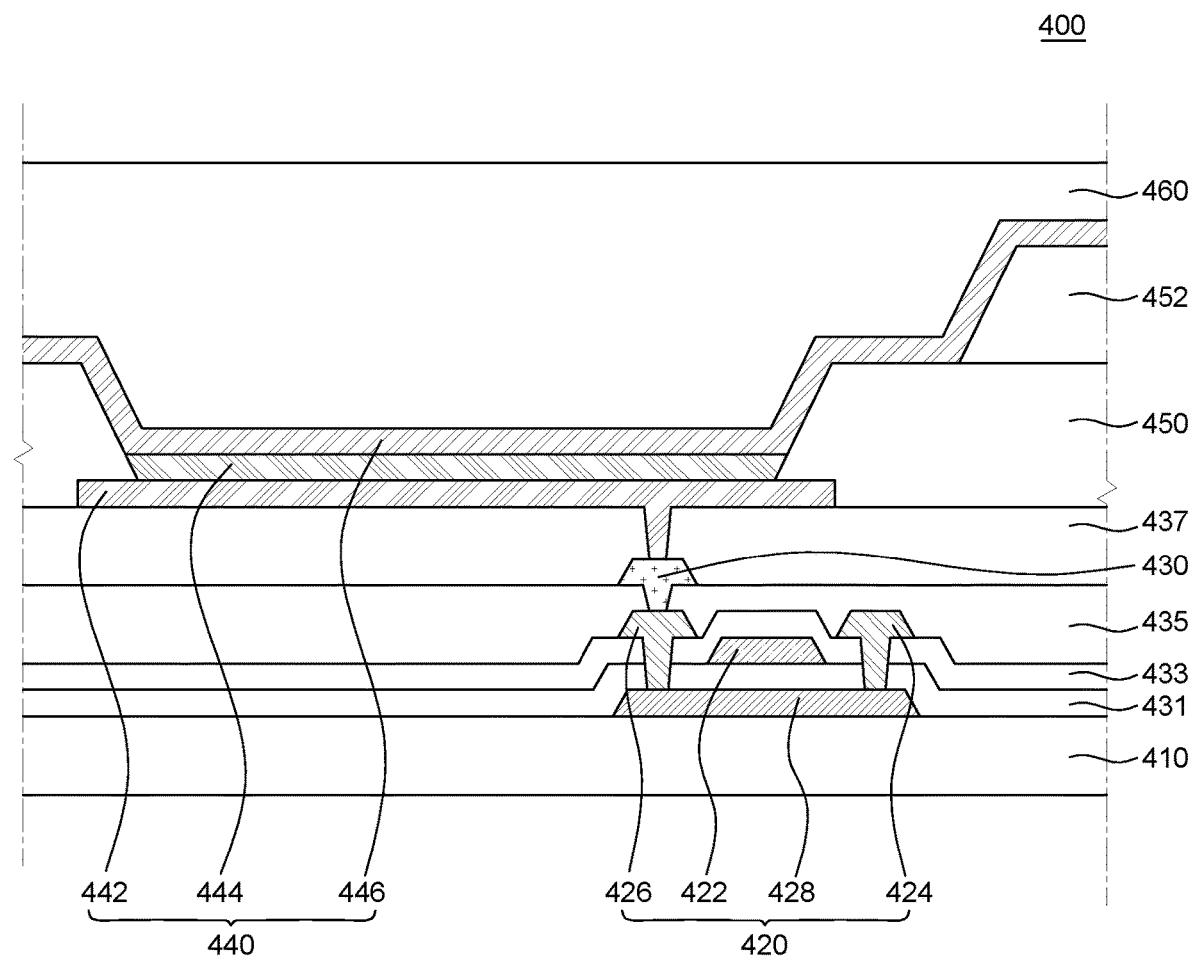
FIGS. 4A and 4B are cross-sectional views of a detailed structure of an active area and a bending area of an electroluminescent display device according to an embodiment of the present disclosure.
Figure 4B:
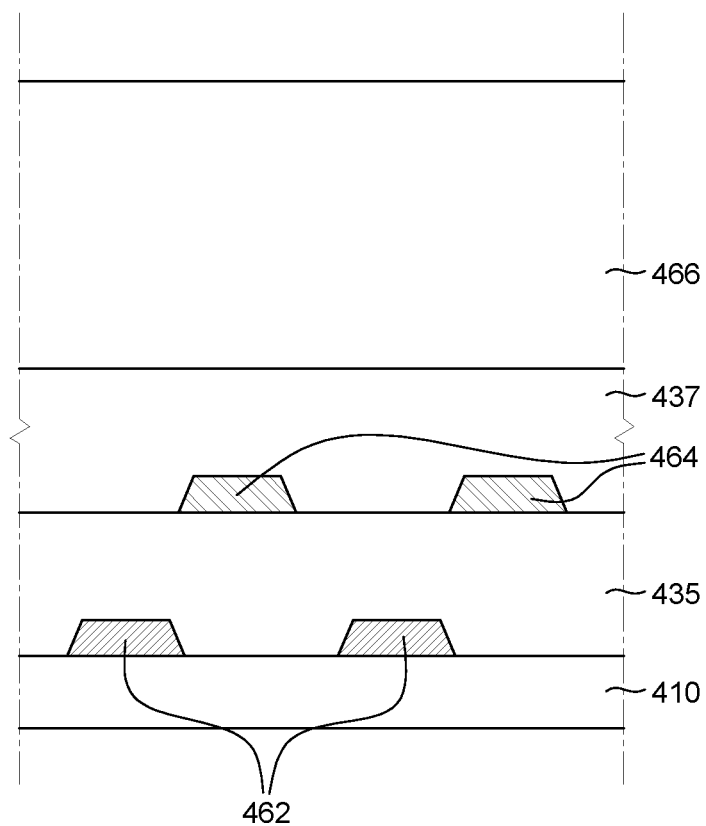

FIGS. 4A and 4B are cross-sectional views of a detailed structure of an active area and a bending area of an electroluminescent display device according to an embodiment of the present disclosure.

FIG. 4A is a cross-sectional view of a detailed structure of the active area A/A illustrated in FIG. 3A.

Referring to FIG. 4A, the substrate 410 serves to support and protect components of the electroluminescent display device 400 disposed above the substrate 410. Recently, the substrate 410 may be formed of a flexible material having flexibility, so that the substrate 410 can be a flexible substrate. For example, the flexible substrate can be a film type including one of a polyester-based polymer, a silicon-based polymer, an acrylic polymer, a polyolefin-based polymer, and a copolymer thereof.

For example, the substrate 410 can be formed of at least one of polyethylene terephthalate (PET), polybutylene terephthalate (PBT), polysilane, polysiloxane, polysilazane, polycarbosilane, polyacrylate, polymethacrylate, polymethylacrylate, polymethylmetacrylate, polyethylacrylate, polyethylmetacrylate, cycloolefin copolymer, (COC), cycloolefin polymer (COP), polyethylene (PE), polypropylene (PP), polyimide (PI), polymethylmethacrylate (PMMA), polystyrene (PS), polyacetal (POM), polyether ether ketone (PEEK), polyester sulfone (PES), polytetrafluoroethylene (PTFE), polyvinyl chloride (PVC), polycarbonate (PC), polyvinylidene fluoride (PVDF), perfluoroalkyl polymer (PFA), styrene acrylic nitrile copolymer (SAN), and a combinations thereof.

A buffer layer can further disposed on the substrate 410. The buffer layer suppresses permeation of moisture or other impurities through the substrate 410 and planarizes a surface of the substrate 410. The buffer layer may be omitted depending on a type of the substrate 410 or a type of a thin film transistor 420 disposed on the substrate 410.

The thin film transistor 420 disposed on the substrate 410 includes a gate electrode 422, a source electrode 424, a drain electrode 426, and a semiconductor layer 428.

The semiconductor layer 428 can be configured by amorphous silicon or polycrystalline silicon, but is not limited thereto. The polycrystalline silicon has a better mobility than that of amorphous silicon and has low power consumption and excellent reliability for the driving thin film transistor in the pixel.

The semiconductor layer can be configured by an oxide semiconductor. The oxide semiconductor has excellent mobility and uniformity. The oxide semiconductor can be configured by an indium tin gallium zinc oxide (InSnGaZnO) based material which is a quaternary metal oxide, an indium gallium zinc oxide (InGaZnO) based material, an indium tin zinc oxide (InSnZnO) based material, an indium aluminum zinc oxide (InAlZnO) based material, a tin gallium zinc oxide (SnGaZnO) based material, an aluminum gallium zinc oxide (AlGaZnO) based material, a tin aluminum zinc oxide (SnAlZnO) based material which are ternary metal oxides, an indium zinc oxide (InZnO) based material, a tin zinc oxide (SnZnO) based material, an aluminum zinc oxide (AlZnO) based material, a zinc magnesium oxide (ZnMgO) based material, a tin magnesium oxide (SnMgO) based material, an indium magnesium oxide (InMgO) based material, an indium gallium oxide (InGaO) based material, which are bimetallic oxides, an indium oxide (InO) based material, a tin oxide (SnO) based material, and a zinc oxide (ZnO), the semiconductor layer 428 may be configured by the above materials, but a composition ratio of individual elements is not limited.

The semiconductor layer 428 can include a source region, a drain region which include n-type or p-type impurities, and a channel between the source region and the drain region and a low concentration doped region between the source region and the drain region adjacent to the channel.

The source region and the drain region are regions doped with a high concentration of impurities and a source electrode 424 and a drain electrode 426 of the thin film transistor 420 are connected thereto, respectively. As the impurity ion, a p-type impurity or an n-type impurity is used. The p-type impurity can be one of boron (B), aluminum (Al), gallium (Ga), and indium (In) and the n-type impurity may be one of phosphorus (P), arsenic (As), and antimony (Sb).

The channel region of the semiconductor 428 may be doped with the n-type impurity or the p-type impurity in accordance with the NMOS or PMOS thin film transistor structure. As the thin film transistor included in the electroluminescent display device according to an embodiment of the present disclosure, the NMOS or the PMOS thin film transistor may be applied.

A first insulating layer 431 is an insulating layer which is configured by a single layer or multiple layers of silicon oxide (SiOx) or silicon nitride (SiNx) and is disposed such that the current flowing in the semiconductor layer 428 does not flow to the gate electrode 422. The silicon oxide has ductility which is lower than that of metal, but is better than that of the silicon nitride and can be formed by a signal layer or multiple layers depending on the characteristic.

The gate electrode 422 serves as a switch which turns on or off the thin film transistor 420 based on an electric signal transmitted from the outside through a gate line. The gate electrode can be configured by a single layer or multiple layers of copper (Cu), aluminum (Al), molybdenum (Mo), chrome (Cr), gold (Au), titanium (Ti), nickel (Ni), and neodymium (Nd) which are conductive metals or an alloy thereof, but is not limited thereto.

The source electrode 424 and the drain electrode 426 are connected to the data line and transmit the electric signal transmitted from the outside from the thin film transistor 420 to the light emitting diode 440. The source electrode 424 and the drain electrode 426 can be configured by a single layer or multiple layers of a metal material such as copper (Cu), aluminum (Al), molybdenum (Mo), chrome (Cr), gold (Au), titanium (Ti), nickel (Ni), and neodymium (Nd) which are conductive metals or an alloy thereof, but are not limited thereto.

In order to insulate the gate electrode 422 from the source electrode 424 and the drain electrode 426, a second insulating layer 433 configured by a signal layer or multiple layers of silicon oxide (SiOx) or silicon nitride (SiNx) can be disposed between the gate electrode 422 and the source electrode 424 and the drain electrode 426.

A passivation layer which is configured by an inorganic insulating layer such as silicon oxide (SiOx) or silicon nitride (SiNx) may be further disposed on the thin film transistor 420. The passivation layer may serve to suppress unnecessary electrical connection between components above and below the passivation layer and suppress contamination or damage from the outside. However, the passivation layer may be omitted in accordance with a configuration and a characteristic of the thin film transistor 420 and the light emitting diode 440.

The thin film transistor 420 may be classified into an inverted staggered structure and a coplanar structure depending on the position of the components which configure the thin film transistor 420. In an inverted staggered thin film transistor, a gate electrode is disposed to be opposite to the source electrode and the drain electrode with respect to the semiconductor layer. As illustrated in FIG. 4A, in a coplanar thin film transistor 420, the gate electrode 422 is located on the same side as the source electrode 424 and the drain electrode 426 with respect to the semiconductor layer 428.

Even though in FIG. 4A, the coplanar thin film transistor 420 has been illustrated, the electroluminescent display device 400 can include an inverted staggered thin film transistor.

For the convenience of description, FIG. 4A illustrates only a driving thin film transistor among various thin film transistors which can be included in the electroluminescent display device 400. Further, a switching thin film transistor and a capacitor are also included in the electroluminescent display device 400. When a signal is applied from a gate line, the switching thin film transistor transmits a signal from the data line to the gate electrode of the driving thin film transistor. The driving thin film transistor transmits a current, which is transmitted through a power line by the signal transmitted from the switching thin film transistor, to the anode 442 and controls the emission by the current which is transmitted to the anode 442.

The planarization layers 435 and 437 are disposed on the thin film transistor 420 to protect the thin film transistor 420, relieve a step generated due to the thin film transistor 420, and reduce a parasitic capacitance generated between the thin film transistor 420, the gate line and the data line, and the light emitting diodes 440.

The planarization layers 435 and 437 can be formed of one or more materials of acrylic resin, epoxy resin, phenolic resin, polyamides resin, polyimides resin, unsaturated polyesters resin, polyphenylene resin, polyphenylenesulfides resin, and benzocyclobutene, but is not limited thereto.

The electroluminescent display device 400 according to an embodiment of the present disclosure can include a first planarization layer 435 and a second planarization layer 437, which are a plurality of planarization layers 435 and 437 that are sequentially laminated.

For example, the first planarization layer 435 is laminated on the thin film transistor 420, and the second planarization layer 437 is sequentially laminated on the first planarization layer 435.

Further, a buffer layer can be disposed on the first planarization layer 435. The buffer layer is disposed to protect components disposed on the first planarization layer 435. The buffer layer can be configured by a single layer of silicon nitride SiNx or silicon oxide SiOx or multiple layers of silicon nitride SiNx or silicon oxide SiOx. However, the buffer layer may be omitted in accordance with the configuration and the characteristic of the thin film transistor 420 and the light emitting diode 440.

An intermediate electrode 430 is connected to the thin film transistor 420 through a contact hole formed on the first planarization layer 435. The intermediate electrode 430 is connected to the thin film transistor 420.

The data line can be formed to have a structure in which a lower layer formed of the same material as the source electrode 424 and the drain electrode 426 and an upper layer formed of the same material as the intermediate electrode 430 are connected. Therefore, the data line is configured with a structure in which two layers are connected in parallel so that a line resistance of the data line can be reduced.

A passivation layer, which is configured by an inorganic insulating layer such as silicon oxide SiOx or silicon nitride SiNx, can be further disposed on the first planarization layer 435 and the intermediate electrode 430. The passivation layer may serve to suppress unnecessary electrical connection between components and suppress contamination or damage from the outside. However, the passivation layer may be omitted in accordance with a configuration and a characteristic of the thin film transistor 420 and the light emitting diode 440.

The light emitting diode 440 disposed on the second planarization layer 437 includes an anode 442, a light emitting unit 444, and a cathode 446.

The anode 442 may be disposed on the second planarization layer 437. The anode 442 is an electrode serving to supply holes to the light emitting unit 444 and is connected to the intermediate electrode 430 through the contact hole on the second planarization layer 437 to be electrically connected to the thin film transistor 420.

The anode 442 can be configured by indium tin oxide (ITO) and indium zin oxide (IZO) which are transparent conductive materials, but is not limited thereto.

When the electroluminescent display device 400 is a top emission type that emits light to an upper portion on which the cathode 446 is disposed, the electroluminescent display device 400 can further include a reflective layer to cause the emitted light to be reflected from the anode 442 and be more easily emitted to an upper direction where the cathode 446 is disposed.

For example, the anode 442 can have a double-layered structure in which a transparent conductive layer configured by a transparent conductive layer and a reflective layer are sequentially laminated or a triple-layered structure in which a transparent conductive layer, a reflective layer, and a transparent conductive layer are sequentially laminated. The reflective layer may be silver (Ag) or an alloy including silver.

A bank 450 disposed on the anode 442 and the second planarization layer 437 can divide an area which actually emits light to define a pixel. The bank 450 is formed by photolithography after forming a photoresist on the anode 442. The photoresist refers to a photosensitive resin whose solubility in a developer is changed by the action of light, and a specific pattern can be obtained by exposing and developing the photoresist. The photoresist may be classified into a positive photoresist and a negative photoresist. The positive photoresist is a photoresist whose solubility of the exposed portion in the developer is increased by the exposure. When the positive photoresist is developed, a pattern from which exposed portions are removed is obtained. The negative photoresist is a photoresist whose solubility of the exposed portion in the developer is significantly lowered by the exposure. When the negative photoresist is developed, a pattern from which non-exposed portions are removed is obtained.

In order to form a light emitting unit 444 of the light emitting diode 440, a fine metal mask (FMM) which is a deposition mask can be used. In order to suppress a damage which may be caused by contact with the deposition mask disposed on the bank 450 and maintain a predetermined distance between the bank 450 and the deposition mask, a spacer 452 which is configured by one of polyimide, photoacryl, and benzocyclobutene (BCB) which are transparent organic materials can be disposed above the bank 450.

The light emitting unit 444 is disposed between the anode 442 and the cathode 446. The light emitting unit 444 serves to emit light and includes at least one layer of a hole injection layer (HIL), a hole transport layer (HTL), an emissive layer, an electron transport layer (ETL), and an electron injection layer (EIL). Some components of the light emitting unit 444 may be omitted in accordance with the structure or the characteristic of the electroluminescent display device 400. Here, as the emissive layer, an electroluminescent layer and an inorganic emissive layer may also be applied.

The hole injection layer is disposed on the anode 442 to smoothly inject the holes. The hole injection layer may be formed of one or more of HAT-CN(dipyrazino[2,3-f:2',3'-h]quinoxaline-2,3,6,7,10,11-hexacarbonitrile), CuPc(phthalocyanine), and NPD(N,N'-bis(naphthalene-1-yl)-N,N'-bis(phenyl)-2,2'-dimethylbenzidine).

The hole transport layer is disposed on the hole injection layer to smoothly transmit holes to the emissive layer. For example, the hole transport layer may be formed of one or more of NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD(2,2',7,7'-tetrakis(N,N-dimethylamino)-9,9-spirofluorene), and MTDATA(4,4',4"-Tris(N-3-methylphenyl-N-phenyl-amino)-triphenylamine).

The emissive layer is disposed on the hole transport layer and includes a material which emits specific color light to emit specific color light. The light emitting material may be formed using a phosphor or a fluorescent material.

When the emissive layer emits red light, a emitting peak wavelength is in the range of 600 nm to 650 nm. The emissive layer can include a host material including CBP (4,4'-bis(carbazol-9-yl)biphenyl) or mCP(1,3-bis(carbazol-9-yl)benzene) and can be formed of a phosphor including a dopant including one or more of PIQIr(acac)(bis(1-phenylisoquinoline)(acetylacetonate)iridium), PQIr(acac)(bis(1-phenylquinoline)(acetyl acetonate)iridium), PQIr(tris(1-phenylquinoline)iridium), and PtOEP(octaethylporphyrin platinum). Alternatively, the emissive layer can be formed of a fluorescent material including PBD:Eu(DBM)3(Phen) or perylene.

Here, the peak wavelength λmax refers to a maximum wavelength of electroluminescence (EL). A wavelength at which emissive layers configuring a light emitting unit emits unique light is referred to as photoluminescence (PL) and light emitted by the influence of the thickness or the optical characteristic of layers configuring the emissive layers is referred to as emittance. In this instance, electroluminescence (EL) refers to light which is finally emitted by the electroluminescent display device and may be represented by a product of photoluminescence (PL) and emittance.

When the emissive layer emits green light, an emitting peak wavelength is in the range of 520 nm to 540 nm. The emissive layer can include a host material including CBP or mCP and may be formed of a phosphor including a dopant material including $Ir(ppy)_3$(tris(2-phenylpyridine)iridium) such as Ir complex. Further, the emissive layer can be formed of a fluorescent material including $Alq_3$(tris(8-hydroxyquinolino)aluminum).

When the emissive layer emits blue light, an emitting peak wavelength is in the range of 440 nm to 480 nm. The emissive layer can include a host material including CBP or mCP and may be formed of a phosphor including a dopant material including FIrPic(bis(3,5-difluoro-2-(2-pyridyl)phenyl-(2-carboxypyridyl)iridium). Alternatively, the emissive layer can be formed of a fluorescent material including any one of spiro-DPVBi(4,4'-Bis(2,2-diphenyl-ethen-1-yl)biphenyl), DSA(1-4-di-[4-(N,N-di-phenyl)amino]styryl-benzene), PFO(polyfluorene) based polymer, and PPV(polyphenylenevinylene) based polymer.

The electron transport layer is disposed on the emissive layer to smoothly move the electrons to the emissive layer. For example, the electron transport layer can be formed of one or more of Liq(8-hydroxyquinolinolato-lithium), PBD (2-(4-biphenyl)-5-(4-tert-butylphenyl)-1,3,4-oxadiazole), TAZ(3-(4-biphenyl)4-phenyl-5-tert-butylphenyl-1,2,4-triazole), spiro-PBD, BCP(2,9-Dimethyl-4,7-diphenyl-1,10-phenanthroline), and BAlq(bis(2-methyl-8-quinolinolate)-4-(phenylphenolato)aluminum).

The electron injection layer can be further disposed on the electron transport layer. The electron injection layer is an organic layer which smoothly injects the electrons from the cathode 446 and may be omitted in accordance with the structure and the characteristic of the electroluminescent display device 400. The electron injection layer can be a metal inorganic compound such as $BaF_2$, LiF, NaCl, CsF, $Li_2O$, and BaO or one or more organic compounds of HAT-CN(dipyrazino[2,3-f:2',3'-h]quinoxaline-2,3,6,7,10, 11-hexacarbonitrile), CuPc(phthalocyanine), and NPD(N, N'-bis(naphthalene-1-yl)-N,N'-bis(phenyl)-2,2'-dimethylbenzidine).

An electron blocking layer or a hole blocking layer which blocks the flow of holes or electrons is further disposed to be close to the emissive layer. Therefore, a phenomenon that when the electrons are injected to the emissive layer, the electrons move from the emissive layer to pass through an adjacent hole transport layer or when the holes are injected to the emissive layer, the holes move from the emissive layer to pass through an adjacent electron transport layer is suppressed to improve luminous efficiency.

The cathode 446 is disposed on the light emitting unit 444 to supply electrons to the light emitting unit 444. Since the cathode 446 needs to supply electrons, the cathode 446 can be configured by a metal material which is a conductive material having a low work function such as magnesium (Mg) or silver-magnesium (Ag:Mg), but is not limited thereto.

When the electroluminescent display device 400 is a top emission type, the cathode 446 can be indium tin oxide (ITO), indium zinc oxide (IZO), indium tin zinc oxide (ITZO), zinc oxide (ZnO), and tin oxide (TiO) based transparent conductive oxide.

An encapsulating unit 460 can be disposed on the light emitting diode 440 to suppress oxidation or damage of the thin film transistor 420 and the light emitting diode 440 which are components of the electroluminescent display device 400, due to moisture, oxygen, or impurities entering from the outside. The encapsulating unit 460 can be formed by laminating a plurality of encapsulating layers and a foreign matter compensating layer, and a plurality of barrier films.

The encapsulating layer is disposed on an entire upper surface of the thin film transistor 420 and the light emitting diode 440 and can be configured by one of silicon nitride (SiNx) or aluminum oxide (AlyOz) which are inorganic materials, but is not limited thereto.

An encapsulating layer can be further disposed on the foreign matter compensating layer disposed on the encapsulating layer.

The foreign matter compensating layer is disposed on the encapsulating layer and uses silicon oxy carbon (SiOCz), acryl, or epoxy based resin, but is not limited thereto. When failure is caused by a crack generated by foreign matters or particles which may be generated during the process, the curve and the foreign matters are covered by the foreign matter compensating layer to be compensated.

A barrier film is disposed on the encapsulating layer and the foreign matter compensating layer so that the electroluminescent display device 400 can delay the permeation of the oxygen and moisture from the outside. The barrier film is configured as a film having translucency and both-sided adhesiveness and may be configured by any one insulating material of olefin-based, acrylic, and silicon-based insulating materials. Further, the barrier film which is configured by any one material of cycloolefin polymer (COP), cycloolefin copolymer (COC), and polycarbonate (PC) may be further laminated, but is not limited thereto.

FIG. 4B is a cross-sectional view of a detailed structure of the bending area B/A illustrated in FIG. 3A.

Some components of FIG. 4B are substantially same/similar to components illustrated in FIG. 4A and a detailed description thereof will be omitted.

A gate signal and a data signal illustrated in FIGS. 1 to 3A are transmitted to pixels disposed in the active area A/A through a circuit line disposed in the non-active area N/A of the electroluminescent display device 400 from the outside to emit light.

When the wiring line disposed in the non-active area N/A including the bending area B/A of the electroluminescent display device 400 is formed of a single-layered structure, more spaces for disposing the wiring lines are required. After depositing the conductive material, a conductive material is patterned by an etching process to form a desired shape of the wiring line. However, since there is a limitation in minuteness of the etching process, more spaces are required due to the limitation for narrowing an interval between wiring lines. Therefore, a size of the non-active area N/A is increased, so that there may be a difficulty in implementing a narrow bezel.

Further, when one wiring line is used to transmit one signal, if the wiring line is cracked, the signal may not be appropriately transmitted. A crack is generated in the wiring line during the process of bending the substrate 410 or a crack is generated on another layer to be propagated to the wiring line. As described above, when the crack is generated in the wiring line, the signal to be transmitted may not be transmitted.

Therefore, the wiring line disposed in the bending area B/A of the electroluminescent display device 400 according an embodiment of the present disclosure can be disposed as a dual wiring line of a first wiring line 462 and a second wiring line 464.

The first wiring line 462 and the second wiring line 464 are formed of a conductive material. The first wiring line 462 and the second wiring line 464 can be formed of a conductive material having excellent ductility to reduce the crack generated during the bending of the flexible substrate 410. For example, the first wiring line 462 and the second wiring line 464 can be formed of a conductive material having excellent ductility such as gold (Au), silver (Ag), and aluminum (Al) and formed of one of various conductive materials used in the active area A/A. The first wiring line 462 and the second wiring line 464 can also be configured by molybdenum (Mo), chrome (Cr), titanium (Ti), nickel (Ni), neodymium (Nd), copper (Cu), and an alloy of silver (Ag) and magnesium (Mg). Further, the first wiring line 462 and the second wiring line 464 can be configured by a multi-layered structure including various conductive materials and for example, configured by a triple-layered structure of titanium (Ti)/aluminum (Al)/titanium (Ti), but are not limited thereto.

In order to protect the first wiring line 462 and the second wiring line 464, a buffer layer formed of an inorganic insulating layer can be disposed below the first wiring line 462 and the second wiring line 464 or a passivation layer formed of an inorganic insulating layer is formed to enclose an upper portion and a side portion of the first wiring line 462 and the second wiring line 464. Therefore, corrosion of the first wiring line 462 and the second wiring line 464 caused by reaction with moisture may be avoided.

When the first wiring line 462 and the second wiring line 464 formed in the bending area B/A are bent, a tensile force may be applied. As illustrated in FIG. 3, the largest tensile force is applied to a wiring line extending along the same direction as the bending direction on the substrate 410 and a crack may be generated in the wiring line. When a severe crack is generated, the wiring line may be broken. Therefore, the wiring line is not formed to extend in the bending direction, but at least a part of the wiring line disposed to include the bending area B/A is formed to extend in a diagonal direction which is different from the bending direction so that the tensile force is minimized to minimize the generation of crack. The shape of the wiring lines can be configured by a rhombus shape, a triangular wave shape, a sinusoidal wave shape, or a trapezoidal wave shape, but is not limited thereto.

The first wiring line 462 is disposed on the substrate 410 and the first planarization layer 435 is disposed on the first wiring line 462. The second wiring line 464 is disposed on the first planarization layer 435 and the second planarization layer 437 is disposed on the second wiring line 464.

The first planarization layer 435 and the second planarization layer 437 can be formed of one or more materials of acrylic resin, epoxy resin, phenolic resin, polyamides resin, polyimides resin, unsaturated polyesters resin, polyphenylene resin, polyphenylenesulfides resin, and benzocyclobutene, but is not limited thereto.

A micro coating layer 466 is disposed on the second planarization layer 437. Since a tensile force is applied to a wiring unit disposed on the substrate 410 at the time of bending to cause a minute crack, the micro coating layer 466 can be formed by coating a position or part that will be bent with a resin having a small thickness to protect the wiring line.

Figure 5:
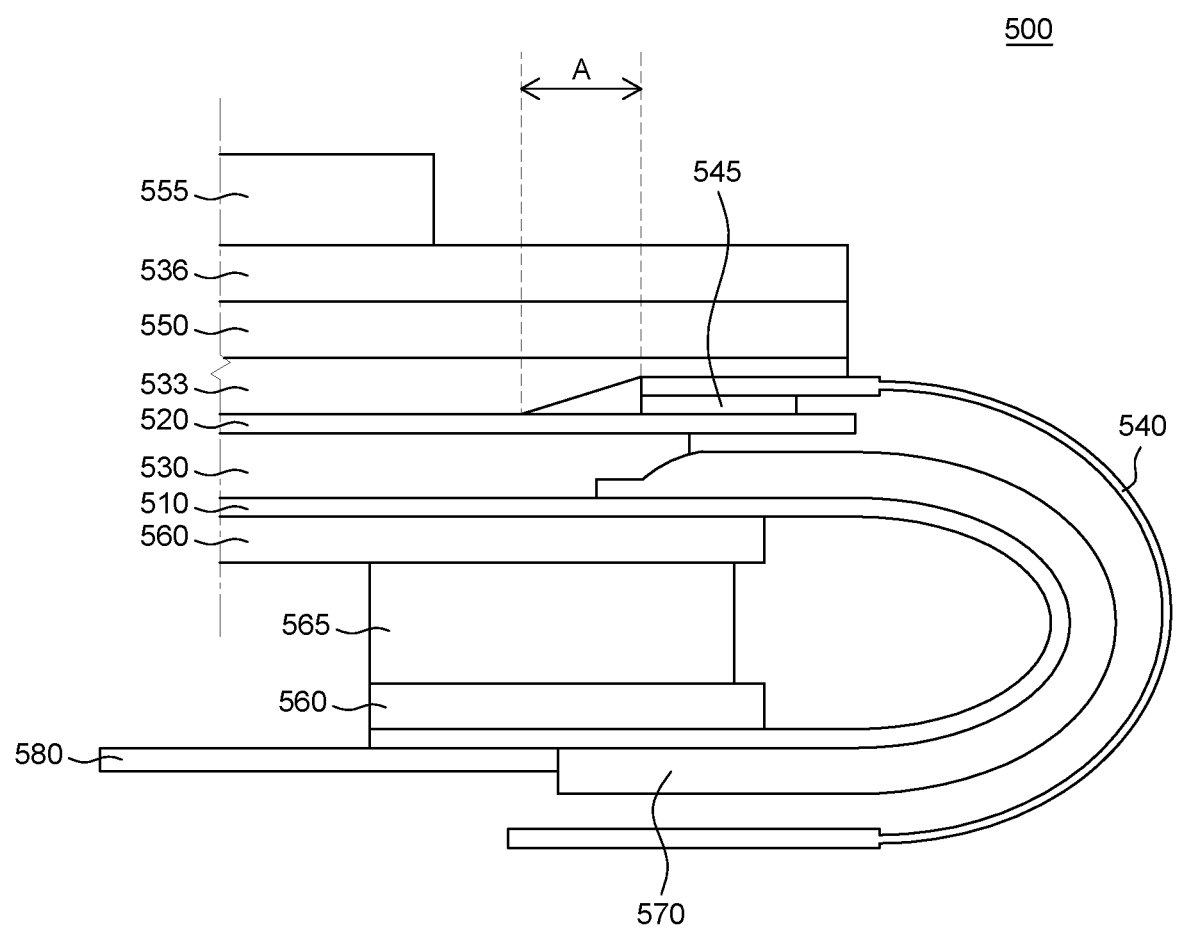
FIG. 5 is a cross-sectional view of a bending area of an electroluminescent display device according to an embodiment of the present disclosure.

FIG. 5 is a cross-sectional view of a bending area of an electroluminescent display device according to an embodiment of the present disclosure.

Some components of FIG. 5 are substantially same/similar to components illustrated in FIGS. 3A and 3B and a detailed description thereof will be omitted.

Referring to FIG. 5, a first adhesive layer 530 is disposed on the flexible substrate 510. The first adhesive layer 530 may be optically cleared adhesive resin (OCR) or optically cleared adhesive film (OCA film), but is not limited thereto.

The touch screen panel 520 which is illustrated in FIG. 3B is disposed on the first adhesive layer 530 and is bonded with the flexible substrate 510 by the first adhesive layer 530 to be fixed. The touch screen panel 520 can be a touch substrate.

The touch screen panel 520 includes a touch area T/A correspondingly disposed on the active area A/A of the flexible substrate 510 and a non-touch area NT/A correspondingly disposed on the non-active area N/A enclosing an outer periphery of an edge of the active area A/A.

The touch pad 545 is disposed in the non-touch area NT/A of the touch screen panel 520 and correspondingly disposed on the non-active area N/A on the flexible substrate 510.

A touch circuit board 540 which is connected to the touch pad 545 and is configured by an insulating film that is disposed at an end of the touch screen panel 520.

Various wiring lines for transmitting signals to the touch electrode disposed in the touch area T/A and a touch sensing circuit for sensing a touch input can be provided on the touch circuit board 540. The touch circuit board can be configured by a flexible printed circuit board and can be disposed to be bent while enclosing an outer periphery of the bending area B/A of the flexible substrate 510 (e.g., the touch circuit board 540 is bent around the bent portion of the flexible substrate 510).

A polarizer 550 is fixed onto the touch screen panel 520 and the touch circuit board 540 to be bonded therewith.

The polarizer 550 suppresses reflection of external light on the active area A/A of the flexible substrate 510. When the display device 500 is used outside, external natural light that enters is reflected by a reflector included in the anode of the electroluminescent element or reflected by an electrode which is formed of a metal and disposed below the organic light emitting diode. Therefore, the image of the display device 500 may not be visibly recognized by the light reflected as described above. The polarizer 550 polarizes the light entering from the outside to a specific direction and suppresses the reflected light from being emitted to the outside of the display device 500.

The polarizer 550 can be arranged to include an area broader than the active area A/A to suppress the reflection of the external light to an outer peripheral area of the active area A/A of the flexible substrate 510. The polarizer 550 included in the electroluminescent display device 500 according to an embodiment of the present disclosure is disposed to cover all the touch screen panel 520 on the active area A/A and one side of the touch circuit board 540 on the non-active area N/A.

In this instance, since the touch circuit board 540 and the touch pad 545 have a predetermined thickness, a predetermined step is generated between the touch screen panel 520 and the touch circuit board 540. Therefore, in the polarizer 550 which is bonded and fixed while simultaneously covering the touch screen panel 520 and one side of the touch circuit board 540, bubbles may be generated due to the step generated in an area adjacent to the touch circuit board 540 so that there may be an area where the polarizer 550 is not boned to the touch circuit board to be loosened. When the polarizer 550 is not satisfactorily bonded and may be loosened, the polarizer 550 may not perform its function so that the image may not be visibly recognized from the outside in some areas.

In order to prevent the above-mentioned problem, a step area where the touch screen panel 520 and the touch circuit board 540 are connected needs to be disposed on the active area A/A to be sufficiently spaced apart from the active area A/A so that the above-described looseness phenomenon is not generated. Therefore, it may be difficult to minimize the bezel area of the electroluminescent display device 500.

Therefore, in the flexible electroluminescent display device 500 according to an embodiment of the present disclosure, a second adhesive layer 533 is disposed above the touch screen panel 520 and the touch circuit board 540 to compensate the step generated in the touch circuit board 540 and the touch pad 545. Here, the second adhesive layer 533 can be a step compensating layer. With respect to the polarizer 550 disposed on the second adhesive layer 533, in an entire area where the polarizer 550 including both the active area A/A and the non-active area N/A is disposed, the generation of bubbles is minimized by the second adhesive layer 533. Therefore, the looseness of the polarizer 550 is suppressed so that the phenomenon that the image is not visibly recognized from the outside in some areas by the looseness can be suppressed.

The touch circuit board 540 and the touch pad 545 are disposed to be adjacent to the active area A/A by minimizing bubbles between the polarizer 550 and the touch screen panel 520 and the touch circuit board 540 and suppressing the looseness of the polarizer 550 so that the bezel area of the electroluminescent display device 500 can be minimized.

When a second adhesive layer 533, which is flexible, is disposed on the touch screen panel 520 and the touch screen board 540 to have a thickness which is larger than a step generated by the touch screen board 540 and the touch pad 545, bubbles are generated in a distance A in FIG. 5 to generate looseness. However, the step is compensated by the second adhesive layer 533 which is flexible to make an upper surface of the second adhesive layer 533 flat and the polarizer 550 thereon is bonded and fixed.

Further, in order to relieve the step generated in an area adjacent to the touch circuit board 540, the second adhesive layer 533 has a relatively small thickness above the touch circuit board 540, and the touch pad 545 and has a relatively large thickness in the other area, and the second adhesive layer 533 can have a predetermined gradient between the small thickness area and the large thickness area.

The polarizer 550 can suppress the insufficient bonding and the looseness caused by the bubbles generated due to the step so that the touch circuit board 540 is disposed to be adjacent to the active area A/A as much as possible. Therefore, a bezel area where the touch circuit board 540 is disposed can be minimized.

A back plate 560 is disposed below the flexible substrate 510. When the flexible substrate 510 is formed of a plastic material such as polyimide, a manufacturing process of the flexible electroluminescent display device 500 is performed in a situation when a support substrate formed of glass is disposed below the flexible substrate 510 and the support substrate is separated to be released after completing the manufacturing process.

A third adhesive layer 536 is disposed on the polarizer 550 to bond a cover glass (CG) 555 which protects an outer appearance of the display device 500.

Since a component for supporting the flexible substrate 510 may be necessary even after releasing the support substrate, the back plate 560 for supporting the flexible substrate 510 can be disposed below the flexible substrate 510.

The back plate 560 can be disposed to be adjacent to the bending area B/A in a region of the flexible substrate 510 other than the bending area B/A. The back plate 560 can be formed of a plastic thin film formed of polyimide, polyethylene naphthalate (PEN), polyethylene terephthalate (PET), polymers, and a combination of the polymers.

A support member 565 is disposed between two back plates 560 and the support member 565 can be bonded to the back plate 560. The support member 565 can be formed of a plastic material such as polycarbonate (PC), polyimide (PI), polyethylene naphthalate (PEN), polyethylene terephthalate (PET), polymers, and a combination of the polymers. A strength of the support member 565 formed of the plastic material can be controlled by adding additives for increasing a thickness and strength of the support member 565. Further, the support member 565 can be formed of glass, ceramic, metal, other rigid materials, or a combination of the above-mentioned materials.

A micro coating layer 570 is disposed on the bending area B/A of the flexible substrate 510.

Since a tensile force is applied to a wiring unit disposed on the flexible substrate 510 at the time of bending to cause a minute crack, the micro coating layer 570 can be formed by coating a position to be bent with a resin having a small thickness to protect the wiring line.

The micro coating layer 570 can adjust a neutral plane of the bending area B/A. The neutral plane means a virtual plane that is not stressed because the compressive force and the tensile force applied to the structure are canceled by each other when the structure is bent. When two or more structures are laminated, a virtual neutral plane can be formed between structures. When the entire structure is bent in one direction, structures disposed in the bending direction with respect to the neutral plane are compressed by the bending so that a compressive force is applied thereto. In contrast, the structures which are disposed in an opposite direction to the bending direction with respect to the neutral plane are stretched so that a tensile force is applied thereto. Normally, when the structures are applied with the tensile force between the compressive force and the tensile force, the structures are more susceptible, so that when the tensile force is applied, the structures are more likely to be cracked.

The flexible substrate 510 disposed below the neutral plane is compressed to be applied with the compressive force and the wiring lines disposed above the neutral plane is applied with the tensile force so that the cracks may be generated due to the tensile force. Therefore, in order to minimize the tensile force applied to the wiring line, the wiring lines may be located on the neutral plane.

The micro coating layer 570 is disposed on the bending area B/A to raise the neutral plane to the upward direction and the neutral plane is formed in the same position as the wiring line or the wiring line is disposed to be higher than the neutral plane. Therefore, the stress is not applied or the compressive force is applied at the time of bending, so that the crack can be suppressed.

The micro coating layer 570 can be configured by resin or configured by an acrylic material or urethane acrylate, but is not limited thereto.

An insulating film 580 is connected to an end of the flexible substrate 510. Various wiring lines for transmitting a signal to the pixels disposed in the active area A/A are formed on the insulating film 580. The insulating film 580 is formed of a material having flexibility to be bent. A driving element can be mounted in the insulating film 580 to form a driving package, such as a chip on film (COF) together with the insulating film 580. The driving element is connected to the wiring line formed on the insulating film 580 to supply a driving signal and data to the pixels disposed in the active area A/A.

The circuit board connected to the insulating film 580 receives an image signal from the outside to apply various signals to the pixels disposed in the active area A/A. The circuit board may be a printed circuit board.

Figure 6A:
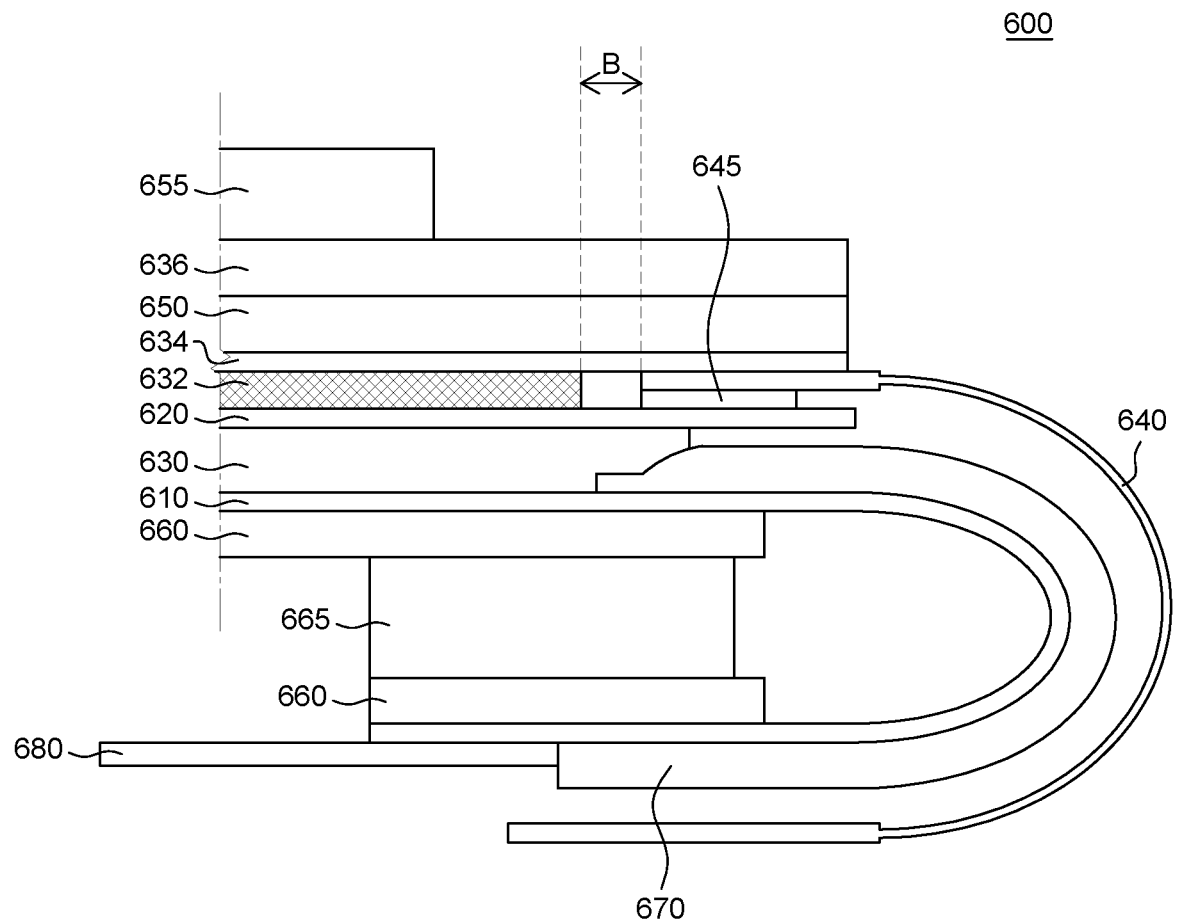
FIGS. 6A and 6B are a cross-sectional view and a perspective view of a bending area of a flexible electroluminescent display device according to another embodiment of the present disclosure.
Figure 6B:
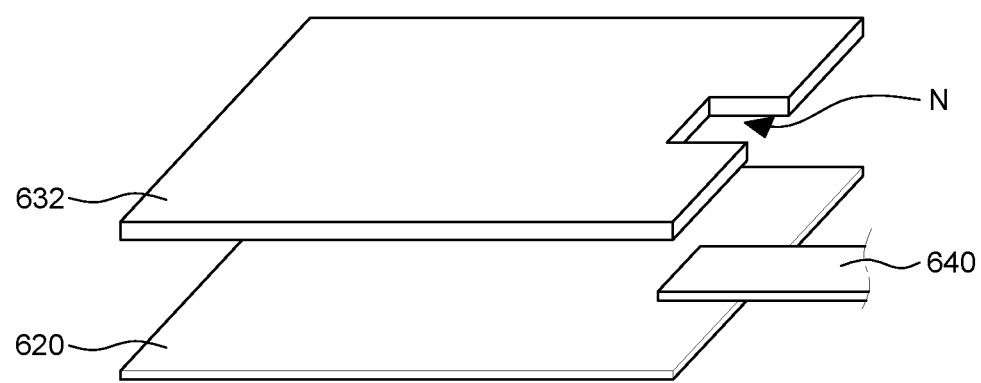

FIGS. 6A and 6B are a cross-sectional view and a perspective view of a bending area of a flexible electroluminescent display device according to another embodiment of the present disclosure.

Some components of FIGS. 6A and 6B are substantially same/similar to components illustrated in FIGS. 3A and 3B and a detailed description thereof will be omitted.

Referring to FIG. 6A, a first adhesive layer 630 is disposed on the flexible substrate 610. The first adhesive layer 630 can be an optically cleared adhesive resin (OCR) or optically cleared adhesive film (OCA film), but is not limited thereto.

The touch screen panel 620, which is illustrated in FIG. 3B, is disposed on the first adhesive layer 630 and is bonded with the flexible substrate 610 by the first adhesive layer 630 to be fixed. The touch screen panel 620 can be a touch substrate.

The touch screen panel 620 includes a touch area T/A correspondingly disposed on the active area A/A of the flexible substrate 610 and a non-touch area NT/A correspondingly disposed on the non-active area N/A enclosing an outer periphery of an edge of the active area A/A.

The touch pad 645 is disposed in the non-touch area NT/A of the touch screen panel 620 and disposed on the non-active area N/A on the flexible substrate 610.

A touch circuit board 640 which is connected to the touch pad 645 and is configured by an insulating film is disposed at an end of the touch screen panel 620.

Various wiring lines for transmitting signals to the touch electrode disposed in the touch area T/A and a touch sensing circuit for sensing a touch input may be provided on the touch circuit board 640. The touch circuit board can be configured by a flexible printed circuit board and can be disposed to be bent while enclosing an outer periphery of the bending area B/A of the flexible substrate 610 (e.g., the touch circuit board 640 bends around the outside of the bent flexible substrate 610).

A barrier layer 632 can be further disposed on the touch screen panel 620 to protect the touch screen panel 620 disposed therebelow from impact or foreign matters from the outside. The barrier layer 632 can be formed of any one material among copolyester thermoplastic elastomer (COP), cycloolefin copolymer (COC), and polycarbonate (PC), but is not limited thereto.

As illustrated in FIG. 6A, the touch circuit board 640 and the touch pad 645 have a predetermined thickness so that a predetermined step is generated between the touch screen panel 620 and the touch circuit board 640. In this instance, when the barrier layer 632, which protects the touch screen panel 620 and the touch circuit board 640, is disposed on the touch screen panel 620, bubbles may be generated in an area adjacent to the touch circuit board 640 due to the step between the touch screen panel 620 and the touch circuit board 640.

The bubbles generated in the area adjacent to the touch circuit board 640 causes the polarizer 650 disposed above the barrier layer 632 not to be appropriately bonded and to be loosened, so that the polarizer 650 does not appropriately perform its function. Therefore, in some areas, the image may not be visibly recognized from the outside. In order to prevent the above-mentioned problem, a step area where the touch screen panel 620 and the touch circuit board 640 are connected needs to be disposed on the active area A/A to be sufficiently spaced apart from the active area A/A so that the above-described looseness phenomenon is not generated. Therefore, it may be difficult to minimize the bezel area of the electroluminescent display device 600.

Therefore, in the flexible electroluminescent display device 600 according to another embodiment of the present disclosure, the barrier layer 632 disposed on the touch screen panel 620 includes a notch region N which is cut to be spaced apart from the area where the touch circuit board 640 is disposed with a predetermined minimum distance B.

The notch region N allows the barrier layer 632 and the touch circuit board 640 to have a predetermined minimum distance B therebetween to minimize the bezel area without affecting the barrier layer 632 and the touch circuit board 640 to each other. The predetermined minimum distance B between the barrier layer 632 and the touch circuit board 640 can be 50 μm, but is not limited thereto. Further, the notch region N can be cut to have a larger width than the width of the touch circuit board 640 so that the barrier layer 632 and the touch circuit board 640 do not affect each other. Further, the notch region N can be cut to have a shape corresponding to the shape of the touch circuit board 640.

A thickness of the barrier layer 632 can be 35 μm to 60 μm, and desirably can be 50 μm. When the barrier layer 632 has the thickness as described above, the barrier layer has the same thickness as the step generated between the touch screen panel 620 and the touch circuit board 640 to compensate the step. Therefore, the touch circuit board 640 is disposed in the notch region N of the barrier layer 632 so that the bezel area can be minimized while suppressing a loosening of the polarizer 650 disposed on the touch screen panel 620.

The notch region N included in the barrier layer 632 will be described in detail with reference to FIG. 6B.

A second adhesive layer 634, which is configured by an optically cleared adhesive resin (OCR) or optically cleared adhesive film (OCA film), is disposed on the barrier layer 632 to be bonded to the polarizer 650 disposed on the second adhesive layer 634 and be fixed.

The polarizer 650 suppresses reflection of external light on the active area A/A of the flexible substrate 610. When the display device 600 is used outside, external natural light enters the device and is reflected by a reflector included in the anode of the electroluminescent element or reflected by an electrode, which is formed of a metal and disposed below the organic light emitting diode. Therefore, the image of the display device 600 may not be visibly recognized by the light reflected as described above. The polarizer 650 polarizes the light entering from the outside to a specific direction and suppresses the reflected light from being emitted to the outside of the display device 600.

The polarizer 650 can be disposed to include an area broader than the active area A/A to suppress the reflection of the external light to an outer peripheral area of the active area A/A of the flexible substrate 610. The polarizer 650 included in the electroluminescent display device 600 according to another embodiment of the present disclosure is disposed to cover the touch screen panel 620 on the active area A/A and the entire one side of the touch circuit board 640 on the non-active area N/A.

A third adhesive layer 636 is disposed on the polarizer 650 to bond a cover glass 655 which protects an outer appearance of the display device 600.

A back plate 660 is disposed below the flexible substrate 610. When the flexible substrate 610 is formed of a plastic material such as polyimide, a manufacturing process of the flexible electroluminescent display device 600 is performed in a situation when a support substrate formed of glass is disposed below the flexible substrate 610 and the support substrate is separated to be released after completing the manufacturing process. Since a component for supporting the flexible substrate 610 may be necessary even after releasing the support substrate, the back plate 660 for supporting the flexible substrate 610 can be disposed below the flexible substrate 610.

The back plate 660 can be disposed to be adjacent to the bending area B/A in a region of the flexible substrate 610 other than the bending area B/A. The back plate 660 can be formed of a plastic thin film formed of polyimide, polyethylene naphthalate (PEN), polyethylene terephthalate (PET), polymers, and a combination of the polymers.

A support member 665 is disposed between two back plates 660 and the support member 665 can be bonded to the back plate 660. The support member 665 can be formed of a plastic material such as polycarbonate (PC), polyimide (PI), polyethylene naphthalate (PEN), polyethylene terephthalate (PET), polymers, and a combination of the polymers. A strength of the support member 665 formed of the plastic material can be controlled by adding additives for increasing a thickness and strength of the support member 665. Further, the support member 665 can be formed of glass, ceramic, metal, other rigid materials, or a combination of the above-mentioned materials.

A micro coating layer 670 is disposed on the bending area B/A of the flexible substrate 610.

Since a tensile force is applied to a wiring unit disposed on the flexible substrate 610 at the time of bending to cause a minute crack, the micro coating layer 670 can be formed by coating a position to be bent with a resin with a small thickness to protect the wiring line.

The micro coating layer 670 can adjust a neutral plane of the bending area B/A. The micro coating layer 670 is disposed on the bending area B/A to raise the neutral plane to the upward direction and the neutral plane is formed in the same position as the wiring line or the wiring line is disposed to be higher than the neutral plane. Therefore, the stress is not applied or the compressive force is applied at the time of bending, so that the crack can be suppressed.

The micro coating layer 670 can be configured by resin or configured by an acrylic material or urethane acrylate, but is not limited thereto.

An insulating film 680 is connected to an end of the flexible substrate 610. Various wiring lines for transmitting a signal to the pixels disposed in the active area A/A are formed on the insulating film 680. The insulating film 680 is formed of a material having flexibility to be bent. A driving element can be mounted in the insulating film 680 to form a driving package such as chip on film (COF) together with the insulating film 680. The driving element is connected to the wiring line formed on the insulating film 680 to supply a driving signal and data to the pixels disposed in the active area A/A.

The circuit board connected to the insulating film 680 receives a video signal from the outside to apply various signals to the pixels disposed in the active area A/A and may be a printed circuit board.

Referring to FIG. 6B, the touch screen panel 620 includes a touch area T/A correspondingly disposed on the active area A/A of the flexible substrate 610 and a non-touch area NT/A correspondingly disposed on the non-active area N/A enclosing an outer periphery of an edge of the active area A/A.

The touch pad 645 is disposed in the non-touch area NT/A of the touch screen panel 620 and disposed on the non-active area N/A on the flexible substrate 620. A touch circuit board 640 which is connected to the touch pad 645 and is configured by an insulating film is disposed at an end of the touch screen panel 620.

A barrier layer 632 can be further disposed on the touch screen panel 620 to protect the touch screen panel 620 disposed therebelow from impact or foreign matters from the outside.

The barrier layer 632, which is disposed on the touch screen panel 620, includes a notch region N which is cut so that the barrier layer 632 is spaced apart from the area where the touch circuit board 640 is disposed with a predetermined minimum distance B (e.g., the notch N, which is cut into the barrier layer 632, can be made large enough so that the barrier layer 632 does not touch the circuit board 640).

The notch region N allows the barrier layer 632 and the touch circuit board 640 to have a predetermined minimum distance B therebetween to minimize the bezel area without affecting the barrier layer 632 and the touch circuit board 640 to each other. The predetermined minimum distance B between the barrier layer 632 and the touch circuit board 640 can be approximately 50 μm, but is not limited thereto.

The notch region N, which is adjusted to an area where the touch circuit board 640 is disposed, is formed by a perforating process by irradiating a laser before a process of laminating the barrier layer 632 onto the electroluminescent display device 600 to be laminated on the electroluminescent display device 600.

The embodiments of the present disclosure can also be described as follows:

According to an aspect of the present disclosure, there is provided a flexible electroluminescent display device. The flexible electroluminescent display device includes a flexible substrate including an active area and a bending area extending from one side of the active area to be bent; a thin film transistor and a light emitting diode on the active area; a touch screen panel on the active area; a touch circuit board which is connected to the touch screen panel and is bent at an outer periphery of the bending area; a polarizer which is disposed on the touch screen panel and covers a part of the touch circuit board; and a step compensating layer which is disposed on the touch screen panel and compensates a step between the touch screen panel and the touch circuit board.

A back plate can be disposed on a lower surface of the flexible substrate.

The back plate can be configured by a plurality of layers.

At least one layer of the plurality of layers of the back plate can be configured by one of polyimide, polyethylene naphthalate (PEN), and polyethylene terephthalate (PET).

A cover glass can be disposed on the polarizer.

An adhesive layer can be disposed between the polarizer and the cover glass to bond the polarizer and the cover glass.

The flexible electroluminescent display device can further include an insulating film connected to the flexible substrate and a circuit driving element on the insulating film.

A micro cover layer can be disposed on the bending area.

The step compensating layer can be an adhesive layer.

The adhesive layer can be configured by a material such as an optically cleared resin (OCR) or optically cleared film (OCA film).

A thickness of the step compensating layer can be larger than that of the step.

The step compensating layer can be a barrier layer.

The step compensating layer can further include a notch region obtained by cutting an area overlapping the touch circuit board.

A thickness of the step compensating layer can be the same as that of the step.

According to another aspect of the present disclosure, there is provided a flexible electroluminescent display device. The flexible electroluminescent display device includes a flexible substrate which includes an active area and a non-active area which encloses an outer periphery of the active area and includes a bending area; a thin film transistor and a light emitting diode on the active area; a touch screen panel on the active area; a touch circuit board which is connected to the touch screen panel and is bent at an outer periphery of the bending area; a polarizer which is disposed on the touch screen panel and covers a part of the touch circuit board; and a step compensating layer which compensates a step between the touch screen panel and an end of the touch circuit board and is disposed on the touch screen panel.

The step compensating layer can be an adhesive layer.

The adhesive layer can be configured by a material such as optically cleared resin (OCR) or optically cleared film (OCA film).

A thickness of the step compensating layer can be larger than that of the step.

The step compensating layer can be a barrier layer.

The step compensating layer can further include a notch region obtained by cutting an area overlapping the touch circuit board.

Although the embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible electroluminescent display device, comprising:

a flexible substrate including an active area and a bending area extending from one side of the active area to be bent;
a thin film transistor and a light emitting diode on the active area;
a touch screen panel on the active area;
a touch circuit board connected to the touch screen panel and bent at an outer periphery of the bending area of the flexible substrate;
a touch pad connecting the touch screen panel and the touch circuit board;
a polarizer disposed on the touch screen panel and covering a portion of the touch circuit board;
a step compensating layer disposed between the touch screen panel and the polarizer, wherein the step compensating layer compensates a step between the touch screen panel and the touch circuit board; and
an adhesive layer disposed on the step compensating layer and covering a portion of the polarizer,
wherein an upper surface of the touch screen panel, a side surface of the step compensating layer, a lower surface of the adhesive layer, a side surface of the touch pad and a side surface of the touch circuit board form a closed curve surrounding an empty space.

2. The flexible electroluminescent display device according to claim 1, wherein the step compensating layer compensates for a height of the step between the touch screen panel and the touch circuit board with a flush upper surface that includes an upper surface of the step compensating layer and an upper surface of the portion of the touch circuit board, and
wherein the polarizer is disposed on the flush upper surface provided by the upper surface of the portion of the touch circuit board and the upper surface of the step compensating layer.

3. The flexible electroluminescent display device according to claim 1, wherein a back plate is disposed on a lower surface of the flexible substrate.

4. The flexible electroluminescent display device according to claim 3, wherein the back plate includes a plurality of layers.

5. The flexible electroluminescent display device according to claim 4, wherein at least one layer of the plurality of layers of the back plate includes at least one of polyimide, polyethylene naphthalate (PEN), or polyethylene terephthalate (PET).

6. The flexible electroluminescent display device according to claim 1, wherein a cover glass is disposed on the polarizer, and
wherein an adhesive layer is disposed between the polarizer and the cover glass to bond the polarizer and the cover glass.

7. The flexible electroluminescent display device according to claim 1, further comprising:
an insulating film connected to the flexible substrate; and
a circuit driving element on the insulating film.

8. The flexible electroluminescent display device according to claim 1, wherein a micro cover layer is disposed on the bending area of the flexible substrate.

9. The flexible electroluminescent display device according to claim 1, wherein the step compensating layer is an adhesive layer including a thick portion on the touch screen panel, and wherein the thick portion of the step compensating layer tapers into a thin portion that overlaps with the portion of the touch circuit board.

10. The flexible electroluminescent display device according to claim 9, wherein the adhesive layer is an optically cleared resin (OCR) or an optically cleared film (OCA film).

11. The flexible electroluminescent display device according to claim 9, wherein the step compensating layer is thicker than the step.

12. The flexible electroluminescent display device according to claim 1, wherein the step compensating layer is a barrier layer.

13. The flexible electroluminescent display device according to claim 12, wherein the step compensating layer includes a notch region including a cutout area overlapping with the portion of the touch circuit board that is covered by the polarizer.

14. The flexible electroluminescent display device according to claim 12, wherein a thickness of the step compensating layer is equal to a thickness the step.

15. A flexible electroluminescent display device, comprising:
a flexible substrate including an active area and a non-active area at an outer periphery of the active area, the non-active area including a bending area;
a thin film transistor and a light emitting diode on the active area;
a touch screen panel on the active area;
a touch circuit board connected to the touch screen panel and bent at an outer periphery of the bending area of the flexible substrate;
a touch pad connecting the touch screen panel and the touch circuit board;
a polarizer disposed on the touch screen panel and overlapping with a portion of the touch circuit board;
a step compensating layer disposed on touch screen panel, wherein the step compensating layer compensates a step between the touch screen panel and an end of the touch circuit board; and
an adhesive layer disposed on the step compensating layer and covering a portion of the polarizer,
wherein an upper surface of the touch screen panel, a side surface of the step compensating layer, a lower surface of the adhesive layer, a side surface of the touch pad and a side surface of the touch circuit board form a closed curve surrounding an empty space.

16. The flexible electroluminescent display device according to claim 15, wherein the step compensating layer is an adhesive layer disposed across the touch screen panel and the portion of the touch circuit board.

17. The flexible electroluminescent display device according to claim 16, wherein the adhesive layer is an optically cleared resin (OCR) or an optically cleared film (OCA film).

18. The flexible electroluminescent display device according to claim 16, wherein a thickness of the step compensating layer is greater than a thickness of the step.

19. The flexible electroluminescent display device according to claim 15, wherein the step compensating layer is a barrier layer.

20. The flexible electroluminescent display device according to claim 19, wherein the step compensating layer includes a notch region having a cutout area overlapping with the touch circuit board.

* * * * *